United States Patent
Wang et al.

(10) Patent No.: US 9,142,275 B2
(45) Date of Patent: Sep. 22, 2015

(54) WORDLINE TRACKING FOR BOOSTED-WORDLINE TIMING SCHEME

(71) Applicant: Taiwan Semiconductor Manufacturing Co. Ltd., Hsin-Chu (TW)

(72) Inventors: Li-Wen Wang, Taichung (TW); Chih-Yu Lin, Taichung (TW); Yen-Huei Chen, Hsinchu County (TW); Hung-Jen Liao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 324 days.

(21) Appl. No.: 13/665,031

(22) Filed: Oct. 31, 2012

(65) Prior Publication Data

US 2014/0119101 A1    May 1, 2014

(51) Int. Cl.
| | | |
|---|---|---|
| *G11C 11/00* | (2006.01) | |
| *G11C 8/08* | (2006.01) | |
| *G11C 16/04* | (2006.01) | |
| *G11C 8/00* | (2006.01) | |
| *G11C 29/02* | (2006.01) | |
| G11C 11/4063 | (2006.01) | |
| G11C 7/00 | (2006.01) | |
| G11C 29/12 | (2006.01) | |

(52) U.S. Cl.
CPC .. *G11C 8/08* (2013.01); *G11C 8/00* (2013.01); *G11C 16/04* (2013.01); *G11C 29/021* (2013.01); *G11C 29/025* (2013.01); *G11C 29/028* (2013.01); G11C 7/00 (2013.01); G11C 11/4063 (2013.01); G11C 2029/1202 (2013.01)

(58) Field of Classification Search
CPC .............. G11C 8/08; G11C 8/00; G11C 8/18; G11C 7/00; G11C 16/04; G11C 11/4063
USPC ................... 365/154, 189.09, 230.06, 233.14
See application file for complete search history.

(56) References Cited

U.S. PATENT DOCUMENTS

| | | | | |
|---|---|---|---|---|
| 6,307,805 | B1 * | 10/2001 | Andersen et al. | 365/230.06 |
| 2008/0068901 | A1 | 3/2008 | Ehrenreich et al. | |
| 2009/0290446 | A1 | 11/2009 | Cheng et al. | |
| 2011/0063932 | A1 * | 3/2011 | Chandra et al. | 365/194 |
| 2011/0158029 | A1 * | 6/2011 | Sasaki | 365/230.06 |
| 2013/0064006 | A1 * | 3/2013 | Garg et al. | 365/154 |
| 2013/0258744 | A1 * | 10/2013 | Romanovskyy | 365/72 |

OTHER PUBLICATIONS

Yan-Pan, et al. Selective Wordline Voltage Boosting for Caches to Manage Yeild Under Process Variations, DAC'09, Jul. 26-31, 2009, p. No. 1-6.

Masaaki Iijima, et al. Low Power SRAM With Boost Driver Generating Pulsed Word Line Voltage for Sub-1V Operation; Journal of Computers, vol. 3, No. 5, May 2008, p. No. 34-40.

* cited by examiner

*Primary Examiner* — Toan Le
(74) *Attorney, Agent, or Firm* — Eschweiler & Associates, LLC

(57) ABSTRACT

Some aspects of the present disclosure a method. In this method, a wordline voltage is provided to a wordline, which is coupled to a plurality of memory cells. A boost enable signal is provided. The state of the boost enable signal is indicative of whether the wordline voltage at a predetermined position on the wordline has reached a non-zero, predetermined wordline voltage. The wordline voltage is selectively boosted to a boosted wordline voltage level based on the boost enable signal.

20 Claims, 3 Drawing Sheets

US 9,142,275 B2

WORDLINE TRACKING FOR BOOSTED-WORDLINE TIMING SCHEME

BACKGROUND

Memory devices have storage capacities that are strongly linked to Moore's law, which states that the number of transistors on integrated circuits doubles approximately every 18 months. Thus, memory devices are one particular class of devices whose density has grown incredibly quickly (e.g., exponentially) in recent decades.

DETAILED DESCRIPTION

Figure 1:
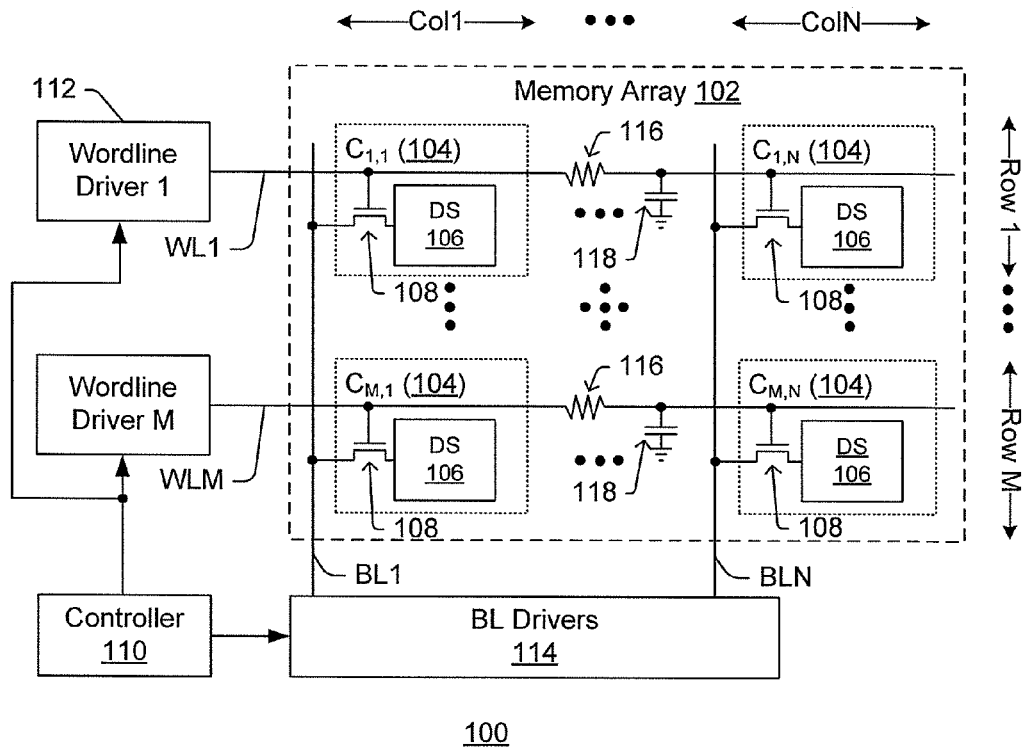
FIG. 1 is a block diagram of a memory device that suffers from some shortcomings.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. The claimed subject matter, however, may be practiced without these specific details.

FIG. 1 illustrates a memory device 100 that, as will be appreciated in more detail below, suffers from some shortcomings. The memory device 100 includes memory array 102 made up of memory cells 104. The memory cells 104 are arranged in M rows (words) and N columns (bits), wherein individual cells are labeled as $C_{ROW,COLUMN}$. Each memory cell 104 includes a data storage element 106 and at least one access transistor 108 that selectively allows access to the data storage element 106. Wordlines WL1, . . . , WLM extend across respective rows of memory cells and are coupled to the gates of access transistors 108 for respective rows. Bitlines BL1, . . . , BLN extend along columns of memory cells and are coupled to source/drain regions of the respective access transistors 108 of the columns.

To write data (e.g., a digital word) to a row of cells, a wordline is asserted to enable the access transistors 108 of the row. While the wordline is asserted, appropriate biases are applied to the bitlines to write respective values to the respective data storage elements 106 of the row. For example, to write a digital word of "1 . . . 0" to the memory cells in Row1, controller 110 instructs WordlineDriver1 112 to pulse WL1 high (e.g., greater than or equal to $V_t$ of the access transistors), which enables NMOS access transistors 108 in Row1. The controller 110 concurrently instructs the bitline drivers 114 to bias BL1 with logical "1" (e.g., to write a "1" to $C_{1,1}$), . . . , and bias BLN with logical "0" (e.g., to write a "0" to $C_{1,N}$). Because WL1 activates the access transistors 108 in the Row1, the bitline biases are applied to the data storage elements 106 in the first row and "flip" the data states stored in the respective data storage elements, if necessary. The wordline voltages of the other rows (e.g., Row2-RowM) typically remain low (e.g., below $V_t$ of the access transistors), such that data is written to only the accessed row (e.g., Row1), although multi-row writes can also occur in some implementations.

Although such a writing scheme is sufficient in many contexts, in some instances, the wordline pulses provided by WL drivers 112 may take unduly long to propagate along the length of the wordlines, due to parasitic resistances 116 and parasitic capacitances 118 associated with the wordlines. This is particularly true in advanced complementary metal oxide semiconductor (CMOS) processes, where the wordlines can have very narrow pitches (resulting in increased resistances relative to previous technology nodes) and where neighboring wordlines can be very closely spaced (resulting in increased capacitance relative to previous technology nodes). These larger RC values lead to a large RC time constant and slow slew rate for the wordline when a wordline pulse is first applied. One way of attempting to speed up the propagation (and/or to account for access transistors that fall into the slow process corner for devices of the memory cell) is to use a higher or "boosted" wordline voltage. Unfortunately, using a higher wordline voltage at all times for each and every memory access would result in larger power consumption compared to using low voltages on the wordlines. Thus, the present disclosure provides for techniques that selectively boost the wordline voltage at specific times when a memory cell is accessed to give a good blend of fast access times and low power consumption.

Figure 2:
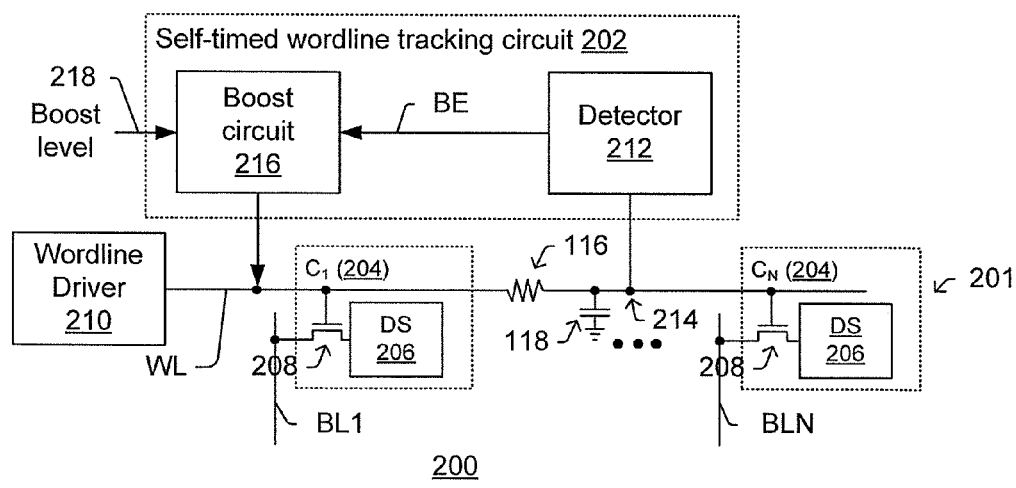
FIG. 2 illustrates some embodiments of a block diagram of a memory device that makes use of write tracking techniques for boosted word lines.

FIG. 2 shows a memory device 200 that includes a self-timed wordline tracking circuit 202 to determine when a boosted wordline voltage should be applied to a wordline WL in accordance with some embodiments. For purposes of simplicity, FIG. 2 illustrates N memory cells 204 arranged in a single row 201, however, it will be appreciated that FIG. 2's tracking circuit 202 is also applicable to multi-row arrays such as shown in FIG. 1, for example. In FIG. 2's memory device 200 (like FIG. 1's memory device 100), each memory cell 204 along the illustrated row 201 includes a data storage element 206 and at least one access transistor 208 that allows selective access to the data storage element 206. A wordline WL, which is driven by a wordline driver 210, extends across the row of memory cells; and bitlines (e.g., BL1 through BLN) extend along columns of memory cells, as shown.

To properly time wordline boosting, a detector 212 is arranged to measure the wordline voltage at a pre-determined location 214 along the wordline. The detector 212 is adapted to measure a wordline voltage at the predetermined position 214 and to provide a boost enable signal (BE) whose state is indicative of whether the measured wordline voltage a has reached a predetermined, non-zero voltage. A boost circuit 216 selectively provides a boosted wordline voltage, which is greater than pre-determined non-zero voltage, based the state of the boost enable signal BE.

In some implementations, the pre-determined, non-zero voltage initially applied to wordline WL by wordline driver 210 corresponds approximately to threshold voltage ($V_t$) of the access transistors 208. Thus, given sufficient time, the pre-determined, non-zero voltage would in many cases be sufficient to put the access transistors 208 into conductive states, thereby coupling bitlines BL1-BLN to respective data storage elements to read or write data thereto. However, to increase the speed or reliability at which data can be written to or read from the data storage elements 206 along the wordline WL, the boost circuit 216 can briefly boost the wordline voltage to a boosted wordline voltage when the BE signal is activated. Although this "boosting" does result in some excess power dissipation, this boosting aids in the speed and/or accuracy or reliability with which data is written to the data storage elements 206. This is because the boosted wordline voltage helps read/write reliability for "slow" transistors with threshold voltages that fall on the high end of the process variation curve, for example.

In some implementations, the boost circuit 216 can selectively boost the wordline voltage to one of at least two different boosted wordline voltage levels (each of which is greater than VT of the access transistors 208), depending on a state of a boost level control signal 218. By changing the boosted wordline voltage level, the boost circuit 216 allows for fine control over a range of power consumption, access times, and/or reliability. For example, in some implementations where the pre-determined, non-zero wordline voltage is set to approximately 0.8 volts, a first boosted wordline voltage could be approximately 0.9 volts, and a second boosted wordline voltage could be approximately 1.0 volts. Any number of different boosted wordline voltage levels could be used, where greater numbers of levels provide greater flexibility but also more overhead.

Figure 3:
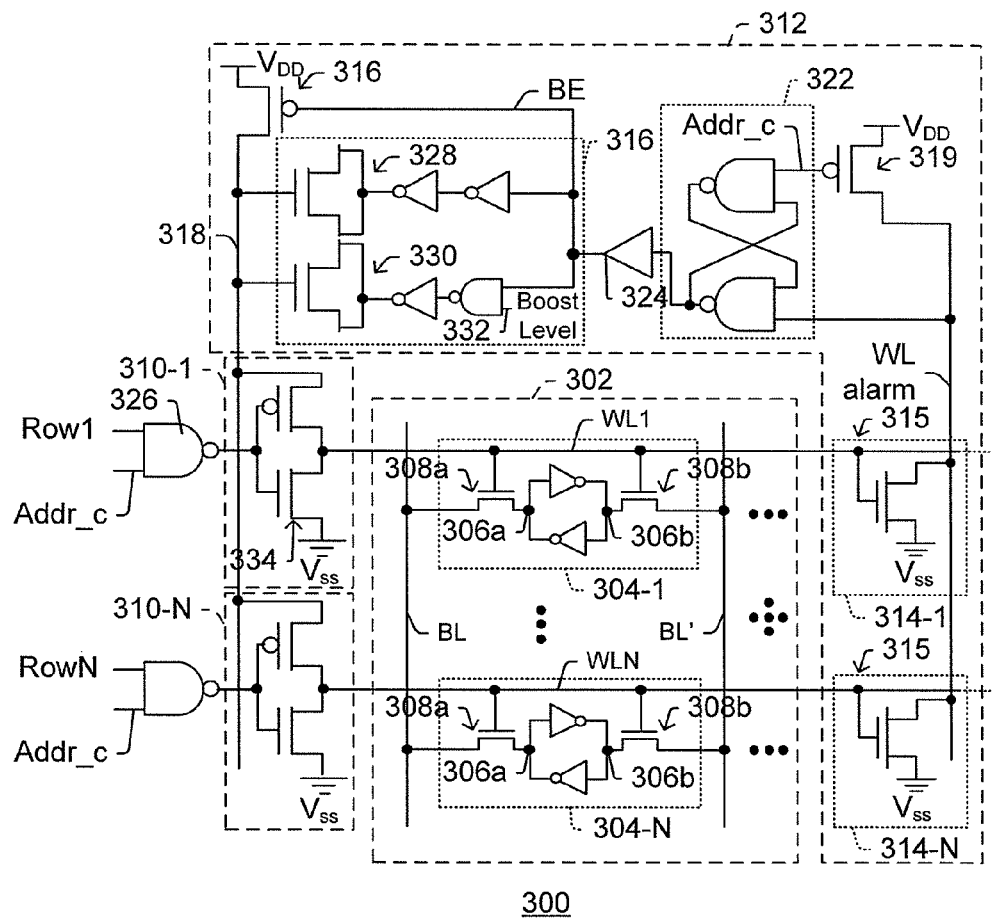
FIG. 3 illustrates some embodiments of a circuit implementation of a memory device that makes use of write tracking techniques for boosted wordlines.

FIG. 3 depicts a more detailed implementation of a memory device 300 that uses wordline boosting techniques in accordance with some embodiments. For purposes of illustration, FIG. 3's memory device 300 is shown to include an array 302 that includes a number of static random access memory (SRAM) cells 304-1 through 304-N. For purposes of convenience, only a single column of SRAM cells is shown in this example, however, multiple columns are often present. In this example, each SRAM memory cell 304 includes a data storage element made up of a pair of cross-coupled inverters which cooperatively store data in complementary storage nodes 306a, 306b. A pair of access transistors (308a, 308b) for each cell 304 selectively couples the complementary storage nodes (306a, 306b, respectively) to complementary bitlines (e.g., BL, BL', respectively), which run along the column of memory cells. Wordline drivers (310-1 through 310-N), which are typically individually and selectively enabled by an address decoder (not shown), have their outputs coupled to wordlines (WL1 through WLN, respectively) running along respective rows.

As will be appreciated in more detail below, a self-timed wordline tracking and boosting circuit 312 is arranged to measure the voltages on the respective wordlines, and selectively boost an applied wordline voltage to a boosted wordline voltage when the measured wordline voltage reaches a pre-determined, non-zero voltage. The self-timed wordline tracking and boosting circuit 312 includes detectors (314-1 through 314-N) which are arranged at predetermined locations (315-1 through 315-N, respectively) along respective wordlines and which measure the respective wordline voltages at the respective predetermined locations. A pre-charge transistor 319 pre-charges WL alarm node, and a latch 322 is also included in the illustrated implementation. The latch 322 controls a boost enable signal (BE), which in turn controls whether a DC supply transistor 316 or a boost circuit 317 supplies power to DC supply node 318 of the wordline drivers 310.

A write operation performed on FIG. 3's memory device 300 is now discussed with reference to FIG. 4, which shows a timing diagram for voltages on various circuit nodes in FIG. 3. As will be appreciated further below, this self-timed write tracking circuit 312 changes a DC supply voltage provided to wordline driver circuits 310 to induce a corresponding change in an applied wordline voltage (e.g., to boost the wordline voltage) at a given time. Thus, for a first part of a read or write operation 401, an initial DC supply voltage (e.g., based on VDD) is provided on the wordline. Subsequently, in a second part of the read or write operation 403, a boosted DC supply voltage, $V_{boost}$ (e.g., greater than VDD) is provided on the wordline. The onset of the boosted wordline voltage is triggered by the BE signal provided by self-timed wordline tracking circuit 312.

Figure 4:
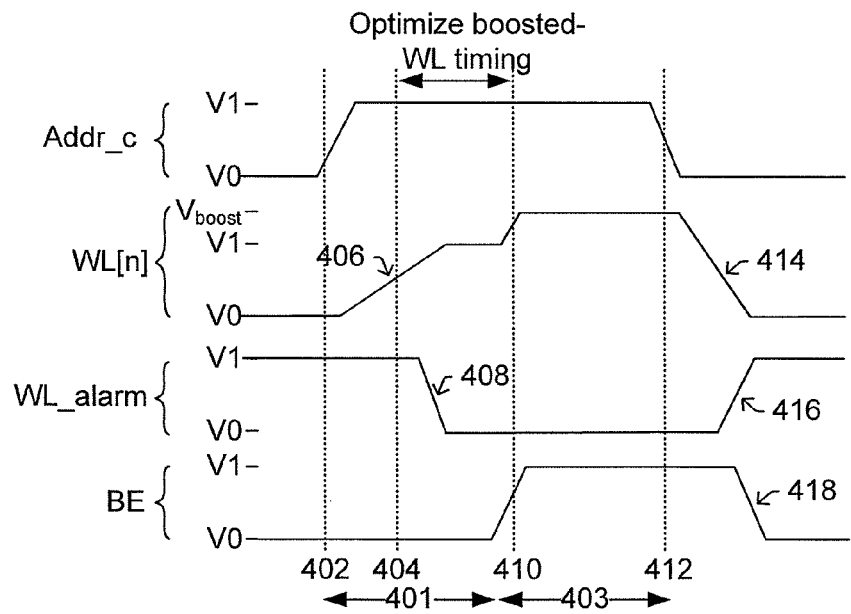
FIG. 4 illustrates some embodiments of a timing diagram corresponding to FIG. 3's circuit implementation.

Referring now to FIG. 3 and FIG. 4 concurrently, the write operation starts when WL_alarm has been pre-charged to a logical 1, WL1 and BE are driven low, and the common address signal (Addr_c) is de-asserted. Because Add_c is a logical "0" and WL alarm is pre-charged to logical "1", latch (322, FIG. 3) outputs a logical "0", which is reinforced by buffer (324, FIG. 3) to drive BE to a logical "0." Thus, the DC power transistor (316, FIG. 3) outputs a first DC supply voltage (e.g., V1) to DC supply node (318, FIG. 3).

At 402, Addr_c is asserted, after which Addr_c is asserted at 404. Just after 404, the address decoder activates a suitable Row enable (e.g., Row1 is asserted in FIG. 3, although Row1 is not shown in FIG. 4). These logical "1"s on input of NAND 326 pull the output of NAND (326, FIG. 3) low. This low voltage activates PMOS transistor in wordline driver 310-1, and thereby pulls wordline WL1 up towards VDD through DC supply transistor 316. Because of wordline loading (e.g., RC time constant due to parasitic resistance and parasitic capacitance on wordline), WL1 can pull up somewhat slowly as shown by 406 in FIG. 4.

As the wordline voltage propagates down the length of wordline WL1, at some point the wordline voltage experienced by the gate of the NMOS detector 314-1 meets or exceeds the threshold voltage of the NMOS detector 314-1. At this point, the NMOS detector 314-1 becomes conducing between its source and drain, and the WL_alarm signal (which had been pre-charged to "1") is pulled down to ground at 408 in FIG. 4. At this point, some or all of the memory cells along WL1 may be accessible. However, because some access transistors (308a, 308b, FIG. 3) may be on the slow end of the process variation curve (or have high VTs on the process variation curve), there are some complementary storage nodes 306a, 306b along WL1 that may still not, in fact, be accessible. Thus, it is appropriate to "boost" the wordline voltage at this point to help ensure accurate read and write operations.

To this end, as WL_alarm is pulled down to ground at 408, it causes the latch (322, FIG. 3) to change its output state (e.g., the latch 322 will now output a logical"1"). The buffer 324 will drive the BE signal to a logical "1". See 410 in FIG. 4. BE being in a "1" state turns off DC supply transistor 316, and concurrently triggers one or more capacitor elements in boost circuit 316 to discharge their stored charge to the DC supply node 318. At time 410 in FIG. 4, this discharged charge results in a boosted voltage $V_{boost}$ on DC supply node 318, wherein the boosted voltage is greater than VDD.

In FIG. 3's example, first and second capacitor elements 328, 330 are realized by virtue of a capacitance between an NMOS gate terminal and the substrate (e.g., source, drain and body region of NMOS device). The voltage level of the boosted wordline voltage depends on the number of capacitor elements that are discharged, which in turn depends on whether boost level signal on 332 is asserted. For example, if the boost level signal is de-activated, only the first capacitor element 328 will discharge when BE goes high, and the wordline voltage on WL1 will be pulsed to a first boosted wordline voltage (Vboost in FIG. 4). In contrast, if the boost level signal on 332 is activated, the first and second capacitor elements 328, 330 will both discharge, causing the DC supply node 318 to go to a second, higher boosted wordline voltage (not shown in FIG. 3). Additional boost levels could also be implemented by using additional capacitor elements.

At some pre-determined time after the wordline WL1 has been held active (time 412 in FIG. 4), the Addr_c signal is taken low. This causes the NAND 326 to deliver a logical "1" to the input of wordline driver 310-1, and correspondingly activates NMOS transistor 334 which pulls the wordline voltage low at 414. At 416, the WL alarm signal is then precharged back to a logical "1", and the BE goes back to the logical "0" state at 418. At this point, the memory device 300 is ready to perform another read or write operation.

It will be appreciated, however, that although FIG. 3's memory device 300 is depicted as including SRAM array 302, the disclosed concepts are equally applicable to other types of memory arrays, including but not limited to: dynamic random access memory (DRAM), flash memory, resistive random access memory (RRAM), magnetic random access memory (MRAM), and read only memory (ROM), among others.

Figure 5:
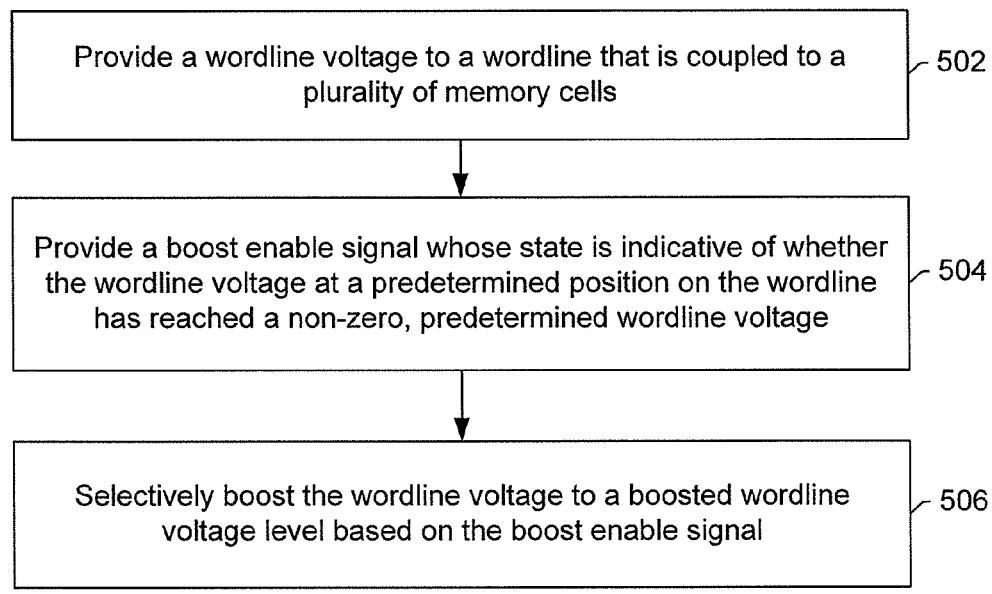
FIG. 5 illustrates some embodiments of a method for providing a boosted wordline voltage.

FIG. 5 shows a method 500 for wordline voltage boosting in accordance with some embodiments. Although this method is illustrated as a series of acts or blocks, it will be appreciated that the order of these acts or blocks can differ from the illustrated implementation, and in some implementations the some acts or blocks can be carried out concurrently. Further, the acts or blocks can be broken up into sub-acts or sub-blocks in some implementations.

The method 500 starts at 502 when a wordline voltage is provided to a wordline, and the wordline is coupled to a plurality of memory cells. In some embodiments, the wordline voltage at 502 is provided at a pre-determined, non-zero voltage that is based on a VDD DC supply voltage. For example, in one implementation the VDD DC supply voltage is approximately 0.8 volts, and the wordline voltage at 502 is approximately 0.8 volts.

At 504, the method 500 provides a boost enable signal whose state is indicative of whether the wordline voltage, as measured at a predetermined position on the wordline, has reached the non-zero, predetermined wordline voltage.

At 506, the method 500 selectively boosts the wordline voltage to a boosted wordline voltage level based on the boost enable signal. For example, if the boost enable signal indicates that the wordline voltage, as measured at the pre-determined position of the wordline has reached the non-zero, pre-determined voltage (e.g., approximately 0.8V); then the wordline voltage can be boosted to the boosted wordline level (e.g., approximately 0.9V or approximately 1.0V). In contrast, so long as the boost enable signal indicates the wordline voltage, as measured at the pre-determined position has not yet reached the non-zero, pre-determined voltage; then the wordline voltage can continue to be applied in a continuous manner without being boosted.

This method provides a good balance between using boosted wordline voltages to provide reliable read and write operations, while limiting the amount of time for which the boosted wordline voltages are applied to limit the amount of power consumed due to the boosted voltages involved. Thus, end users may benefit from slightly longer useful device lifetime between battery charges (due to the reduced power consumption), and also have fewer data errors due to bad read or write operations.

Some aspects of the present disclosure a method. In this method, a wordline voltage is provided to a wordline, which is coupled to a plurality of memory cells. A boost enable signal is provided. The state of the boost enable signal is indicative of whether the wordline voltage at a predetermined position on the wordline has reached a non-zero, predetermined wordline voltage. The wordline voltage is selectively boosted to a boosted wordline voltage level based on the boost enable signal.

In another embodiment, a memory device includes a wordline driver configured to output a wordline voltage to a wordline which is coupled to a plurality of memory cells. A detector is arranged at a predetermined position along on the wordline. The detector is configured to induce a change in a boost enable signal whose state is indicative of whether the wordline voltage at the predetermined position has a predetermined relationship with a predetermined, non-zero wordline voltage. A boost circuit selectively boosts the wordline voltage to a boosted wordline voltage level based on the boost enable signal.

Another embodiment relates to memory device. The memory device includes a memory array including a plurality of memory cells arranged in a series of rows and a series of columns. Memory cells along a row have respective access transistors which have respective gates coupled to the wordline. A wordline driver has an output coupled to the wordline. A detector is arranged at a predetermined position on the wordline to induce a change in a boost enable signal whose state is indicative of whether a wordline voltage at the predetermined position has reached approximately a threshold voltage of an access transistor. A boost circuit selectively provides a boosted wordline voltage, which is greater than the threshold voltage of the access transistor, based on the boost enable signal.

Although the disclosure has been shown and described with respect to one or more implementations, equivalent alterations and modifications will occur to a person of ordinary skill in the art based upon a reading and understanding of this specification and the annexed drawings. For example, although the illustrated wordline tracking techniques may utilize particular arrangements of p-type and n-type transistors in the illustrated embodiments, the polarity of these transistors can be switched in other embodiments along with a corresponding change in bias. Also, although the illustrated embodiments show SRAM cells with six transistors, which may also be referred to as 6T SRAM cells, other memory cells or SRAM cells with more or fewer than six transistors can also be used in other implementations. In these other embodiments, the write tracking cells will often mirror the structural arrangement of the SRAM cells to provide for more accurate modeling or "matching" between the actual SRAM cells and the tracking cells.

Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A method, comprising:
providing a wordline voltage to a wordline that is coupled to a plurality of memory cells;
measuring the wordline voltage at a predetermined position on the wordline and providing a boost enable signal whose state is based on a comparison between the measured wordline voltage has and a non-zero, predetermined wordline voltage; and
selectively boosting the provided wordline voltage to a boosted wordline voltage level based on the boost enable signal.

2. The method of claim 1, wherein the non-zero, predetermined wordline voltage corresponds approximately to a threshold voltage of an access transistor of a memory cell.

3. The method of claim 1, wherein selectively boosting the wordline voltage to the boosted wordline voltage level is accomplished by inducing one or more capacitive elements to discharge.

4. The method of claim 1, wherein the wordline voltage is provided to the wordline based on a DC supply voltage being provided to a DC supply node of a wordline driver.

5. The method of claim 4, wherein the boosted wordline voltage is provided to the wordline based on at least one capacitive element discharging stored charge to the DC supply node of the wordline driver.

6. The method of claim 5, wherein the at least one capacitive element discharges the stored charge to the DC supply node while the DC supply voltage is disconnected from the DC supply node.

7. A memory device, comprising:
a wordline driver configured to output a wordline voltage to a wordline coupled to a plurality of memory cells;
a detector arranged at a predetermined position along on the wordline, the detector configured to measure a wordline voltage at the predetermined position and to induce a change in a boost enable signal based on a comparison between the measured wordline voltage and a predetermined, non-zero wordline voltage; and
a boost circuit to selectively boost the wordline voltage to a boosted wordline voltage level based on the boost enable signal.

8. The memory device of claim 7, wherein the boosted wordline voltage is sufficient to enable an access transistor, the access transistor being coupled to a memory cell arranged between the wordline driver and an end of the wordline.

9. The memory device of claim 7, wherein the boost circuit is adapted to selectively boost the wordline voltage to one of at least two different boosted wordline voltage levels.

10. The memory device of claim 7, wherein the boost circuit is coupled to a DC supply node of the wordline driver.

11. The memory device of claim 10, wherein the boost circuit is configured to selectively provide the boosted wordline voltage to the DC supply node based on the boost enable signal.

12. The memory device of claim 11, further comprising:
a DC power supply transistor coupled to the DC supply node;
wherein so long as the boost enable signal is in a first state, the DC power supply transistor supplies a DC voltage supply corresponding approximately to VDD to the DC supply node.

13. The memory device of claim 12, wherein, when the boost enable signal is in a second state, the DC power transistor is put into a high resistance state to de-couple the DC supply node from the DC voltage supply and the boost circuit provides the boosted wordline voltage to the DC supply node.

14. The memory device of claim 7, wherein a memory cell is a static-random access memory (SRAM) cell including a pair of cross-coupled inverters.

15. A memory device, comprising:
a memory array including a plurality of memory cells arranged in a series of rows and a series of columns, wherein memory cells along a row have respective access transistors which have respective gates coupled to a wordline;
a wordline driver having an output coupled to the wordline;
a first detector arranged at a predetermined position on the wordline to measure a wordline voltage at the predetermined position and to induce a change in a boost enable signal whose state is based on whether the wordline voltage at the predetermined position has reached approximately a threshold voltage of an access transistor; and
a boost circuit to selectively provide a boosted wordline voltage based on the boost enable signal.

16. The memory device of claim 15, further comprising:
a second wordline driver having an output coupled to a second wordline, the second wordline coupled to gates of respective access transistors of a second row of memory cells in the memory array; and
a second detector arranged at a predetermined position on the second wordline and configured to induce the change in the boost enable signal.

17. The memory device of claim 16, wherein the memory device includes a wordline alarm node coupled to the first and second detectors.

18. The memory device of claim 17, wherein the wordline alarm node is pre-charged to a first voltage level prior to wordline activation during a memory operation, and wherein the first or second detector pulls the wordline alarm node to a second, different voltage level when the corresponding wordline voltage has reached approximately the threshold voltage of the access transistor.

19. The memory device of claim 15, wherein the boost circuit is adapted to selectively boost the wordline voltage to one of at least two different boosted wordline voltage levels depending on a state of a boost level control signal.

20. The memory device of claim 15, wherein a memory cell is a static-random access memory (SRAM) cell including a pair of cross-coupled inverters.

* * * * *